United States Patent
Takizawa

(10) Patent No.: US 9,559,035 B2
(45) Date of Patent: Jan. 31, 2017

(54) SEMICONDUCTOR DEVICE

(71) Applicant: FUJI ELECTRIC CO., LTD., Kawasaki-shi (JP)

(72) Inventor: Naoki Takizawa, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/205,782

(22) Filed: Jul. 8, 2016

(65) Prior Publication Data
US 2016/0322274 A1    Nov. 3, 2016

Related U.S. Application Data

(63) Continuation of application No. PCT/JP2015/066386, filed on Jun. 5, 2015.

(30) Foreign Application Priority Data

Jul. 18, 2014  (JP) ................. 2014-148296

(51) Int. Cl.
H01L 23/48    (2006.01)
H01L 23/36    (2006.01)
H01L 23/12    (2006.01)
H01L 25/065   (2006.01)

(52) U.S. Cl.
CPC ............ H01L 23/36 (2013.01); H01L 23/12 (2013.01); H01L 25/0655 (2013.01)

(58) Field of Classification Search
CPC ....... H01L 23/36; H01L 23/12; H01L 23/0655
See application file for complete search history.

(56) References Cited

U.S. PATENT DOCUMENTS 7,069,645 B2 *   7/2006  Ishikawa ............ H05K 3/04
                                                174/255
7,154,753 B2 *  12/2006  Kobayashi ......... H05K 1/0203
                                                257/706
2002/0138973 A1 * 10/2002 Ishikawa ............ H05K 3/04
                                                 29/739

(Continued)

FOREIGN PATENT DOCUMENTS

JP   2002-57280 A    2/2002
JP   2010-062203 A   3/2010
JP   2013-229363 A  11/2013

OTHER PUBLICATIONS

PCT, "International Search Report for International Application No. PCT/JP2015/066386".

Primary Examiner — Nicholas Tobergte
(74) Attorney, Agent, or Firm — Manabu Kanesaka

(57) ABSTRACT

A semiconductor device includes a laminated substrate having circuit boards, an insulating plate, and a metal plate laminated, and warped convexly to the circuit board side; semiconductor chips fixed to the corresponding circuit boards; a base plate having a predetermined disposition region in which the laminated substrate is disposed, grooves disposed in the outer periphery of the disposition region, and projections disposed in positions in the disposition region adjacent to and inside the grooves. The grooves has on the projection side an inclination corresponding to an inclination caused by the warp of the laminated substrate. A joining material fills the space between the metal plate and the disposition region and covers the grooves and projections.

10 Claims, 11 Drawing Sheets

(56) References Cited

U.S. PATENT DOCUMENTS

2004/0160754 A1* 8/2004 Kobayashi ........... H05K 1/0203
361/783
2006/0191707 A1* 8/2006 Ishikawa ................. H05K 3/04
174/250
2013/0193591 A1 8/2013 Groening et al.

* cited by examiner

SEMICONDUCTOR DEVICE

CROSS-REFERENCE TO RELATED APPLICATION

This is a continuation application of PCT/JP2015/066386 filed on Jun. 5, 2015, which claims priority of Japanese Patent Application No. 2014-148296 filed on Jul. 18, 2014, the disclosure of which is incorporated herein.

TECHNICAL FIELD

The present invention relates to a semiconductor device.

BACKGROUND ART

A main portion of an example of a heretofore known semiconductor device is shown in a sectional view (FIG. 9(a)) and a plan view (FIG. 9(b)).

A semiconductor device 101 shown in FIGS. 9(a) and 9(b) includes a metal base plate 102. The base plate 102 has through holes 102a for mounting the semiconductor device 101 to a heat sink (not shown) with bolts. A laminated substrate 103 is joined to the top of the base plate 102 by a joining material 104. The joining material 104 is specifically a solder. The laminated substrate 103 is formed of an insulating plate 131, a metal plate 132 provided on one surface of the insulating plate 131, and circuit boards 133 which are provided on the other surface of the insulating plate 131 and which form a predetermined circuit. The laminated substrate 103 is, for example, a DCB (Direct Copper Bond) substrate.

Semiconductor chips 105, such as IGBTs (insulated gate bipolar transistors), are electrically and mechanically connected to the circuit board 133 by respective conductive joining materials 106. "Being electrically and mechanically connected" is defined as including not only a case in which objects are connected together by direct joining, but also a case in which objects are connected together via a conductive joining material, such as a solder or a metal sintered material, and the same applies in the following description.

As the base plate 102 and laminated substrate 103 of the heretofore described of semiconductor device 101 are different in heat expansion coefficient from one another, heat stress is applied to the joining material 104 due to the heat generation when the semiconductor chips 105 are in operation. Further, when the semiconductor device 101 is in operation, there is fear that cracks are generated in the joining material 104 by repetition of the heat stress. FIG. 10 shows an ultrasonic observation image, wherein the condition of cracks generated in the joining material is observed. FIG. 10 is an image of the joining material 104 seen from above, wherein the white portions show cracks. As shown in FIG. 10, cracks are generated in an outer periphery, such as at four corners, of the joining material 104, and grow inward. Also, in order to prevent the generation and growth of cracks in the joining material 104, it is effective to form the joining material 104 to a certain thickness.

In order to form the joining material 104 to a certain thickness, projections 121 are disposed on the principal surface of the base plate 102. The distance between the base plate 102 and the metal plate 132 is defined by the projections 121, thus obtaining the joining material 104 with the same thickness as the height of the projections 121.

However, it is not possible to sufficiently secure the thickness of the joining material 104 in the outer peripheral portion of the metal plate 132 in the case of the semiconductor device 101 including a laminated substrate 103A, a convex warp of which to the circuit board 133 side is large, as shown in FIG. 11. Therefore, there is fear that the cracks are generated in the outer peripheral portion of the joining material 104. The warp of the laminated substrate 103A occurs due to, for example, the difference between the total volume of the circuit board 133 and the total volume of the metal plate 132.

Even in the case of the laminated substrate 103A, where the convex warp at the circuit board 133 side is large, it is possible to prevent the generation of cracks by increasing the height of the projections 121 and increasing the thickness of the outer peripheral portion of the joining material 104. However, the increase in the height of the projections 121 also leads to an increase in the thickness of the central portion of the joining material 104 which is not high in heat conductivity. Therefore, there is fear that the heat conductivity from the metal plate 132 to the base plate 102 deteriorates, and that the heat dissipation property from the semiconductor chips 105 to the external deteriorates.

PTL 1 describes a semiconductor device wherein a projection on a base plate is positioned in a region separated 1 to 10 mm from the peripheral edge of a circuit board of a laminated substrate, and a groove of a rectangular shape in section is provided on the side closer to the peripheral edge than the projection. Even in the case of a laminated substrate whose warp is large, the groove serves to maintain the thickness of a joining material between the base plate and the circuit board of the laminated substrate. However, the groove of the base plate described in PTL1 has a space of a rectangular shape in section. As the region in the groove in which the joining material is thick is wide when the groove is rectangular, there is a room for improvement in the heat dissipation property from the laminated substrate to the base plate. Also, the groove described in PTL 1 is such that it is difficult for voids in the joining material to come out when joining, and that there is a room for improvement in the reliability of the joining material.

Also, PTL 2 describes a semiconductor device wherein grooves are formed in a surface of a base plate in order to bring the base plate into close contact with a heat sink, thereby controlling the warped shape of the base plate. However, the grooves described in PTL 2 do not contribute effectively to an adjustment of the thickness of a joining material.

CITATION LIST

Patent Literature

PTL 1: JP-A-2002-57280
PTL 2: US Patent Application Publication No. 2013/0193591

SUMMARY OF INVENTION

Technical Problem

The invention is to advantageously solve the heretofore described problems and has for its object to provide a semiconductor device which can enhance heat dissipation property while preventing cracks from being generated and growing in a joining material between a base plate and a laminated substrate.

Solution to Problem

A semiconductor device of an aspect of the invention includes a laminated substrate, semiconductor chips, a base plate, and a joining material. The laminated substrate includes circuit boards, an insulating plate, and a metal plate laminated, and warped convexly to the circuit board side. The semiconductor chips are fixed to the corresponding circuit boards. The base plate has a predetermined disposition region in which the laminated substrate is disposed, grooves disposed in the outer periphery of the disposition region, and projections disposed in positions in the disposition region adjacent to and inside the grooves. The grooves have on the projection side an inclination corresponding to an inclination caused by the warp of the laminated substrate. The joining material fills the space between the metal plate and the disposition region and fills the grooves.

Also, a semiconductor device of another aspect of the invention includes a laminated substrate, semiconductor chips, a base plate, and a joining material. The laminated substrate includes circuit boards, an insulating plate, and a metal plate laminated and is warped convexly to the circuit board side. The semiconductor chips are fixed to the corresponding circuit boards. The base plate has a predetermined disposition region in which the laminated substrate is disposed, grooves disposed in the outer periphery of the disposition region, and projections disposed in positions in the disposition region adjacent to and inside the grooves. The grooves are disposed continuously one on each short-side side of the disposition region and disposed on the long-side sides of the disposition region except the central portions. The joining material fills the space between the metal plate and the disposition region and fills the grooves.

Advantageous Effects of Invention

According to the semiconductor device of the invention, it is possible to enhance heat dissipation property while preventing cracks from being generated and growing in the joining material between the base plate and the laminated substrate.

DESCRIPTION OF EMBODIMENTS

Figure 1A:
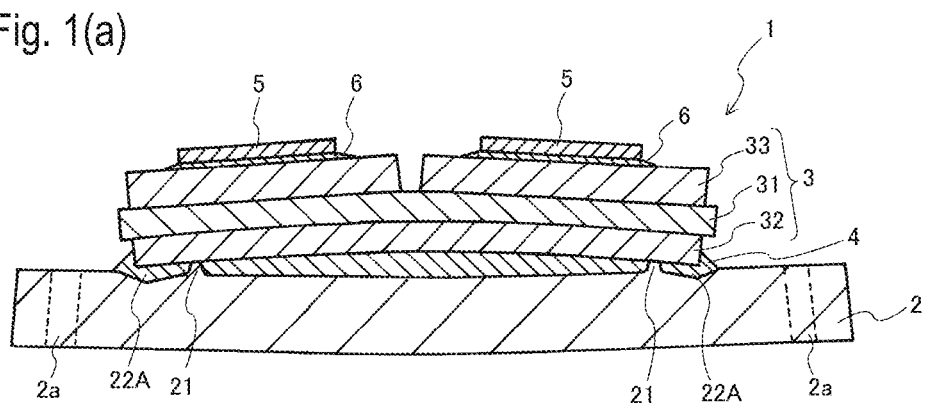
FIGS. 1(a) and 1(b) are illustrations of a semiconductor device according to Embodiment 1 of the invention.

Hereafter, a specific description will be given, while referring to the drawings, of embodiments of a semiconductor device of the invention.

Embodiment 1

Figure 1B:
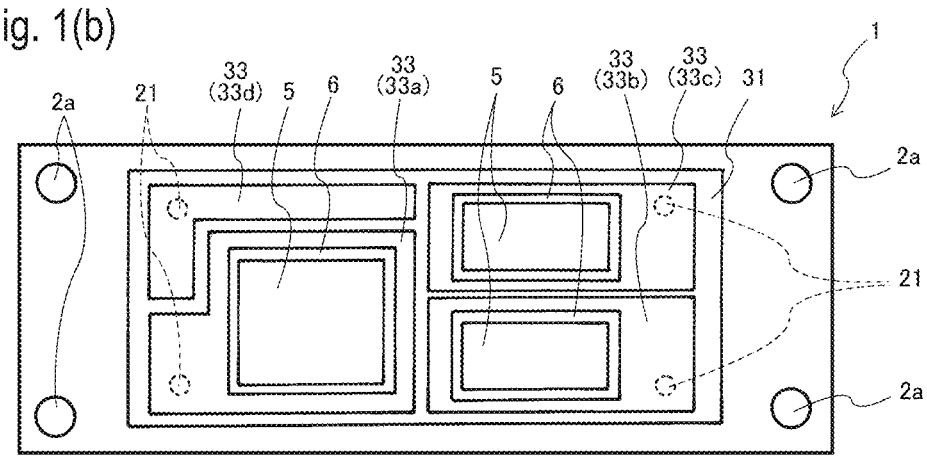

FIGS. 1(a) and 1(b) illustrate a sectional view (FIG. 1(a)) and a plan view (FIG. 1(b)) of a semiconductor device 1 of Embodiment 1 of the invention. The semiconductor device 1 includes a laminated substrate 3, semiconductor chips 5, a base plate 2, and a joining material 4.

Also, the semiconductor device 1 of the invention also includes members not shown in FIGS. 1(a) and 1(b). For example, wiring members for electrically connecting the electrodes of the semiconductor chips 5 to circuit boards 33, external terminals electrically and mechanically connected to the circuit boards 33, a frame body housing the semiconductor chips 5, laminated substrate 3, a seal material filling the internal space of the frame body, and the like are included.

The laminated substrate 3 is formed with the circuit boards 33, an insulating plate 31, and a metal plate 32 being laminated, as shown in FIGS. 1(a) and 1(b).

The insulating plate 31 is made of, for example, insulating ceramics, such as aluminum nitride, silicon nitride, or aluminum oxide, and the metal plate 32 and the circuit boards 33 are made of, for example, copper. The insulating plate 31 and the metal plate 32 have a substantially rectangular shape in plan. Further, the circuit boards 33 have circuit boards 33a, 33b, 33c, and 33d on each of which a predetermined circuit pattern is formed in the example shown in the drawing. In order to secure the creepage distance of the circuit boards 33, both the long and short sides of the insulating plate 31 are larger than those of the metal plate 32 and circuit boards 33. As the laminated substrate 3, a DCB substrate or the like wherein the metal plate 32 and the circuit boards 33 are joined directly to the insulating plate 31 can be used.

Each semiconductor chip 5 has an electrode on each of the front and rear surfaces. Further, the electrode on the rear surface is electrically and mechanically connected to each respective circuit board 33a, 33b, and 33c by a conductive joining material 6 such as a solder. The semiconductor chip 5 is specifically, for example, an IGBT, a power MOSFET, or a SBD (Schottky barrier diode). The semiconductor chip 5 may be formed of a silicon semiconductor, or may be formed of a SiC semiconductor. When the semiconductor chip 5 is an IGBT, the electrode on the rear surface is a collector electrode, and the electrodes on the front surface are an emitter electrode and a gate electrode. When the semiconductor chip 5 is a power MOSFET made of silicon carbide (SiC), the power MOSFET, having a high breakdown voltage compared with a semiconductor chip made of silicon and being switchable at a high frequency, is most suitable as the semiconductor chip 5 of the semiconductor device of this embodiment. However, the semiconductor chip 5 is not limited to an IGBT or power MOSFET, only, and may be a combination of one or a plurality of semiconductor elements which can operate to switch.

The base plate 2 has on the principal surface thereof a predetermined disposition region in which the laminated substrate 3 is disposed. Further, grooves 22A are disposed in an outer periphery, such as at four corners, of the disposition region. Furthermore, projections 21 disposed in positions in the disposition region inside the grooves 22A are disposed adjacent to the grooves 22A. The joining material 4, such as a solder, fills the space between the metal plate 32 of the laminated substrate 3 and the predetermined disposition region of the base plate 2, thus joining the laminated substrate 3 and base plate 2. At this time, by the base plate 2 and metal plate 32 being joined by the joining material 4 in a condition in which the leading ends of the projections 21 are in abutment with the metal plate 32 of the laminated substrate 3, it is possible to control the thickness of the joining material 4 between the base plate 2 and the metal plate 32.

Figure 2:
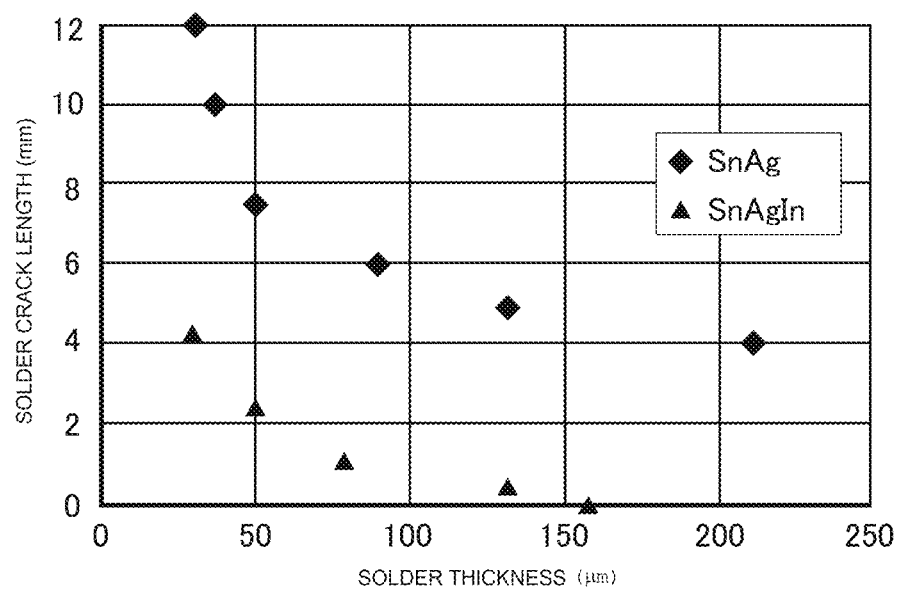
FIG. 2 is a graph showing the relationship between the length of cracks and the thickness of solders.

FIG. 2 shows a result obtained by examining, using two types of solder, the relationship between the length of cracks generated in the solder which is the joining material 4 and the thickness of the solder after a test of 300 heat cycles. As can be seen from FIG. 2, it is possible to prevent a growth of cracks by the solder thickness being 100 µm or more. However, when the solder between the base plate 2 and the metal plate 32 exceeds 300 µm, deterioration in heat dissipation property becomes noticeable. Consequently, to take into account the prevention of crack generation and growth and the heat dissipation property, it is preferable to set the solder thickness to 100 µm or more and 300 µm or less. That is, it is preferable that the height of the projections 21 is 100 µm or more and 300 µm or less.

The projections 21 are provided in positions on the principal surface of the base plate 2 in the vicinities of the four corners of the disposition region of the laminated substrate 3, and in positions in the disposition region outside the positions on the principal surface of the base plate 2 onto which the semiconductor chips 5 are vertically projected. For example, the projections 21 are provided in positions on the order of 2 to 10 mm, preferably, on the order of 3 to 5 mm inside the long and short sides of the disposition region. The projections 21 can be formed by, for example, pressing the base plate 2.

Also, the base plate 2 has, outside the disposition region, through holes 2a for mounting a heat sink (not shown) to the surface opposite to the principal surface with bolts. When mounting the base plate 2 to the heat sink with the bolts, the heat dissipation property is enhanced by applying grease or the like, but the base plate 2 is often warped convexly to the heat sink side in order for grease to spread allover. Therefore, when the laminated substrate 3 warped convexly to the circuit board 33 side is used, the warp direction is reversed as shown in FIGS. 1(a) and 1(b), meaning that the thickness of the joining material 4 at the end portions of the laminated substrate 3 is likely to decrease further. Therefore, the problem that the joining material 4 cracks comes into prominence.

Figure 3:
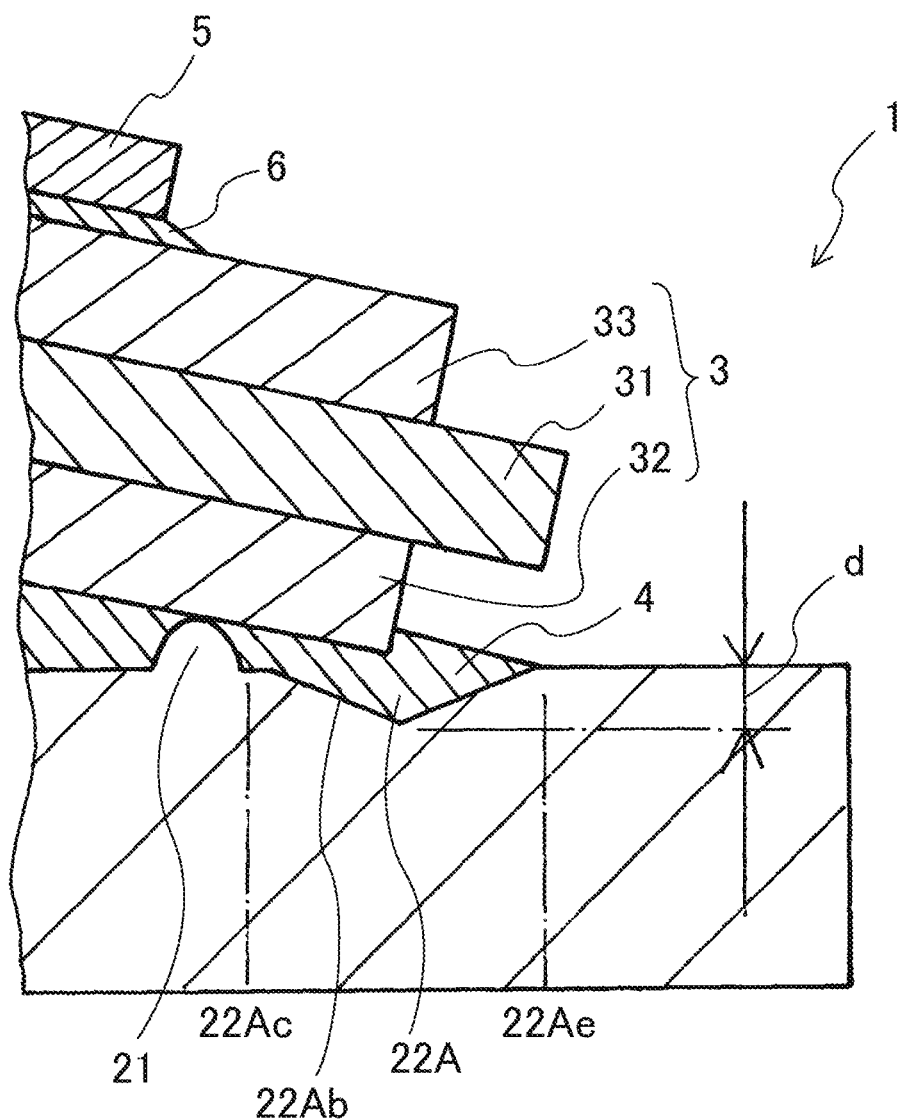
FIG. 3 is a sectional view of the vicinity of a groove of a base plate of Embodiment 1 of the invention.

FIG. 3 shows an enlarged sectional view of the vicinity of the projection 21 of the base plate 2. In the base plate 2, the groove 22A is disposed adjacent to the projection 21 and in the outer periphery of the disposition region. The groove 22A in vertical section has on the projection 21 side an inclination 22Ab corresponding to the inclination caused by the warp of the laminated substrate 3, and the shape in section of the inclination 22Ab is triangular. Further, the groove 22A is filled with the joining material 4, and the joining material 4 filling the groove 22A contacts the metal plate 32. Therefore, the thickness of the joining material 4 can be partially increased within the region of the groove 22A. Consequently, it is possible, even when the laminated substrate 3 warps, to secure a desired solder thickness (100 µm or more) on the outer peripheral side of the base plate 2 outside the projection 21.

The depth of the groove 22A only has to be set to a depth such that a distance in a vertical direction from a surface of the metal plate 32 of the laminated substrate 3 to the groove 22A is 100 µm or more. In order to set the thickness of the joining material 4 to 100 µm or more regardless of the warpage of the laminated substrate 3, it is preferable that a depth d of the groove 22A is a maximum depth of 100 µm or more from the front surface of the base plate 2.

However, when the groove 22A exceeds 300 µm, it is not preferable because there is fear that the effect of crack prevention saturates or the heat dissipation property deteriorates. It is preferable that the position of the maximum depth of the groove 22A is set to be the same as the position when the end of the metal plate 32 of the laminated substrate 3 is vertically projected on the base plate 2.

An inward end portion 22Ac of the groove 22A on the principal surface of the base plate 2 is positioned so as to be outside the semiconductor chip 5 and projection 21. This is to take into account the heat dissipation property of the semiconductor chip 5. Also, an outward end portion 22Ae of the groove 22A is positioned in or inside the same position as the position when the end of the insulating plate 31 of the laminated substrate 3 is vertically projected on the base plate 2. This is to prevent the groove 22A from interfering with the frame body when fixing the frame body (not shown), with an insulating adhesive, to a position on the base plate 2 outside the disposition region of the laminated substrate 3.

Figure 4:
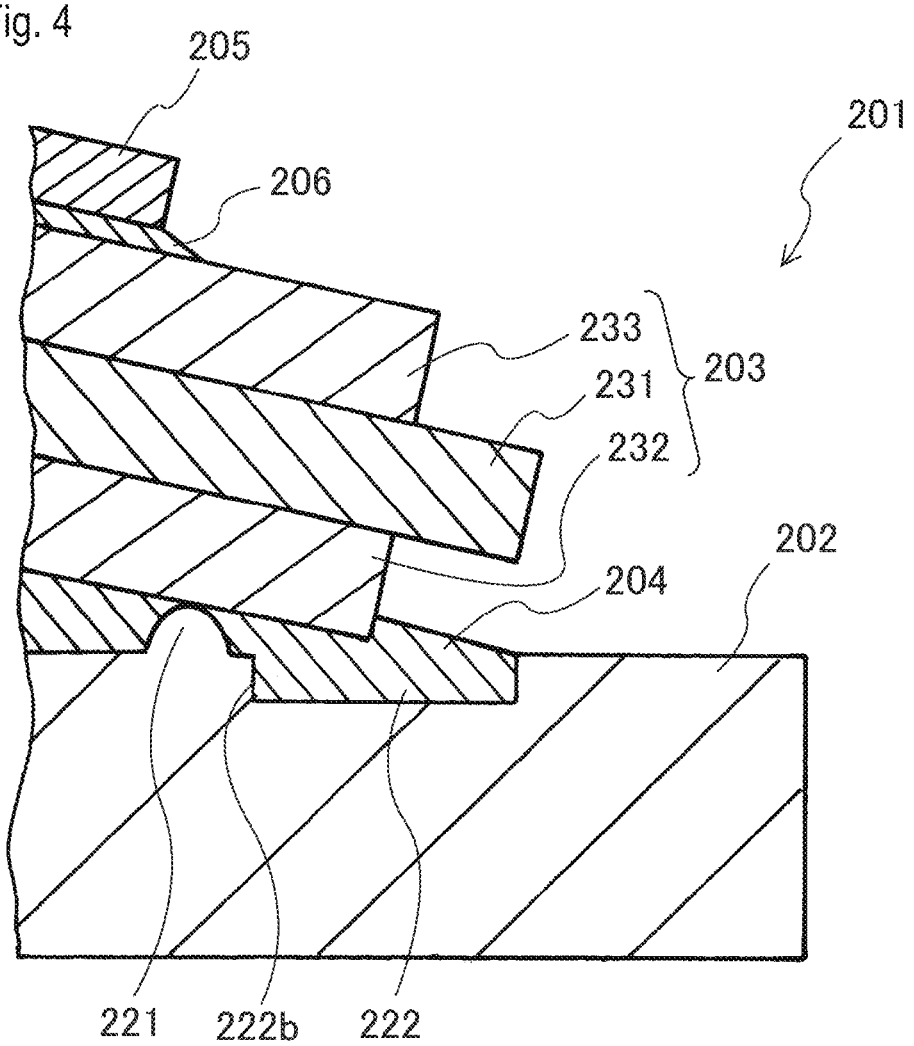
FIG. 4 is a sectional view of the vicinity of a groove of a base plate of a reference example.

FIG. 4 shows a sectional view of the vicinity of a groove of a base plate 202 in a semiconductor device 201 which is a reference example. A laminated substrate 203 is formed with a circuit board 233, an insulating plate 231, and a metal plate 232 being laminated. The electrode on the rear surface of a semiconductor chip 205 is electrically and mechanically connected to the circuit board 233 by a conductive joining material 206 such as a solder.

A groove 222 of a rectangular shape in section is provided in the base plate 202. The difference from the groove 22A of this embodiment is that, instead of the inclination 22Ab corresponding to the warp of the laminated substrate, a vertical side surface 222b is provided on the projection side.

In the reference example shown in FIG. 4, the thickness of a joining material 204 in the vicinity of the side surface 222b is substantially equal to the sum of the height of a projection 221 and the depth of the groove 222. Therefore, the joining material 204 is considerably thick in the vicinity of the side surface 222b compared with a predetermined thickness (that is, the height of the projection 21). As a result, the heat dissipation property from the laminated substrate 3 to the base plate 2 deteriorates dramatically in the outer periphery of the metal plate 232.

Meanwhile, in the groove 22A shown in FIG. 3, the inclination 22Ab corresponding to the inclination caused by the warp of the laminated substrate 3 is provided adjacent to the projection 21. Therefore, the thickness of the joining material 4 between the metal plate 32 and the base plate 2 can be maintained at a predetermined range of thickness in the outer periphery of the metal plate 32. Therefore, it is possible to successfully keep the heat dissipation property from the laminated substrate 3 to the base plate 2 even in the outer periphery of the metal plate 32.

Also, voids generated in the joining material 4 melting when joining are more likely to come out from the groove 22A having the inclination 22Ab than from the groove 222 having the vertical side surface 222b. Therefore, the reliability of the joining material is high, and it is possible to further prevent the crack generation and growth.

Also, a die with substantially right-angled corners is needed when forming the groove 222 of the reference example by pressing the base plate 202. However, the die has the problems that the die has a difficult high level of pressing, the corners of the die wear down easily, and so on.

Meanwhile, the groove 22A can be formed by pressing using a die with obtuse-angled triangular corners. The pressing has a low difficult level of pressing compared with in the reference example, and the die life is also long. Therefore, it is possible to reduce manufacturing cost.

Figure 5:
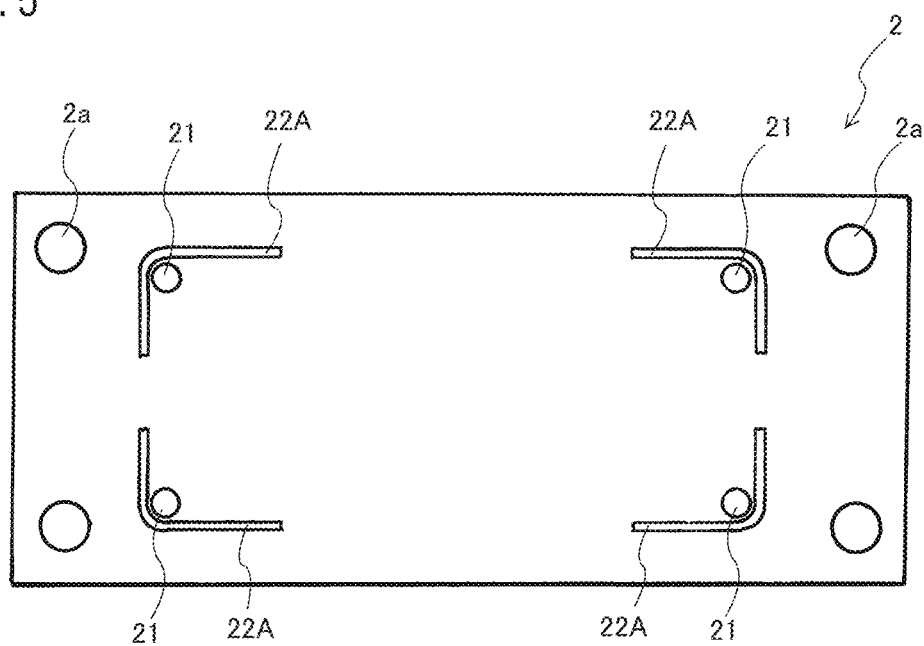
FIG. 5 is a plan view of the base plate of Embodiment 1 of the invention.

FIG. 5 is a plan view of the base plate 2 in the first embodiment.

As shown in FIG. 5, the grooves 22A are disposed outside each of the four corners of the disposition region, and surround the four projections 21 on the two outer sides of the respective projection 21. Further, the grooves 22A are disposed on the short sides of the disposition region, and on the long sides of the disposition region, except the respective central portions.

Figure 10:
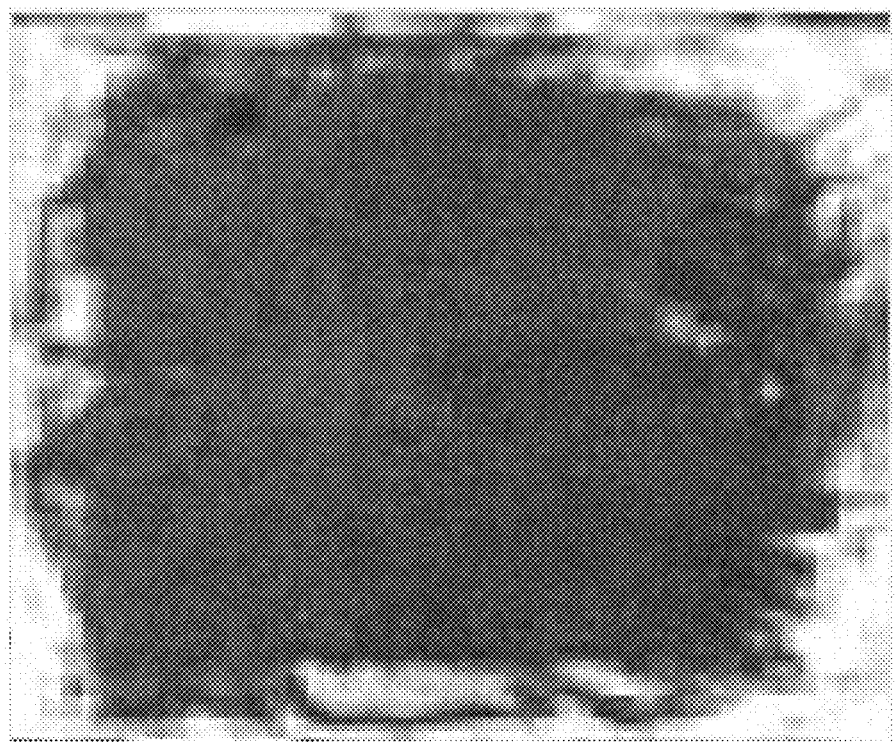
FIG. 10 is an ultrasonic observation image showing the condition of cracks in a joining material.
Figure 11:
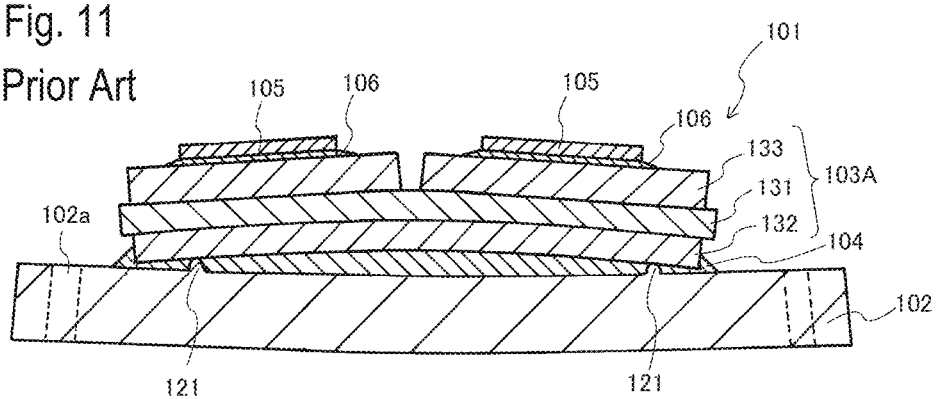
FIG. 11 is a sectional view of an example of the heretofore known semiconductor device.

Cracks are generated from an outer periphery, such as four corners, of the substantially square shape in plan of the joining material 4, and grow toward the central portion of the joining material 4, as shown in FIG. 10. Consequently, by disposing the grooves 22A of the base plate 2 at least in a region including an outer periphery, such as the four corners, of the disposition region, as shown in FIG. 5, it is possible to efficiently prevent the generation and growth of cracks.

Figure 6:
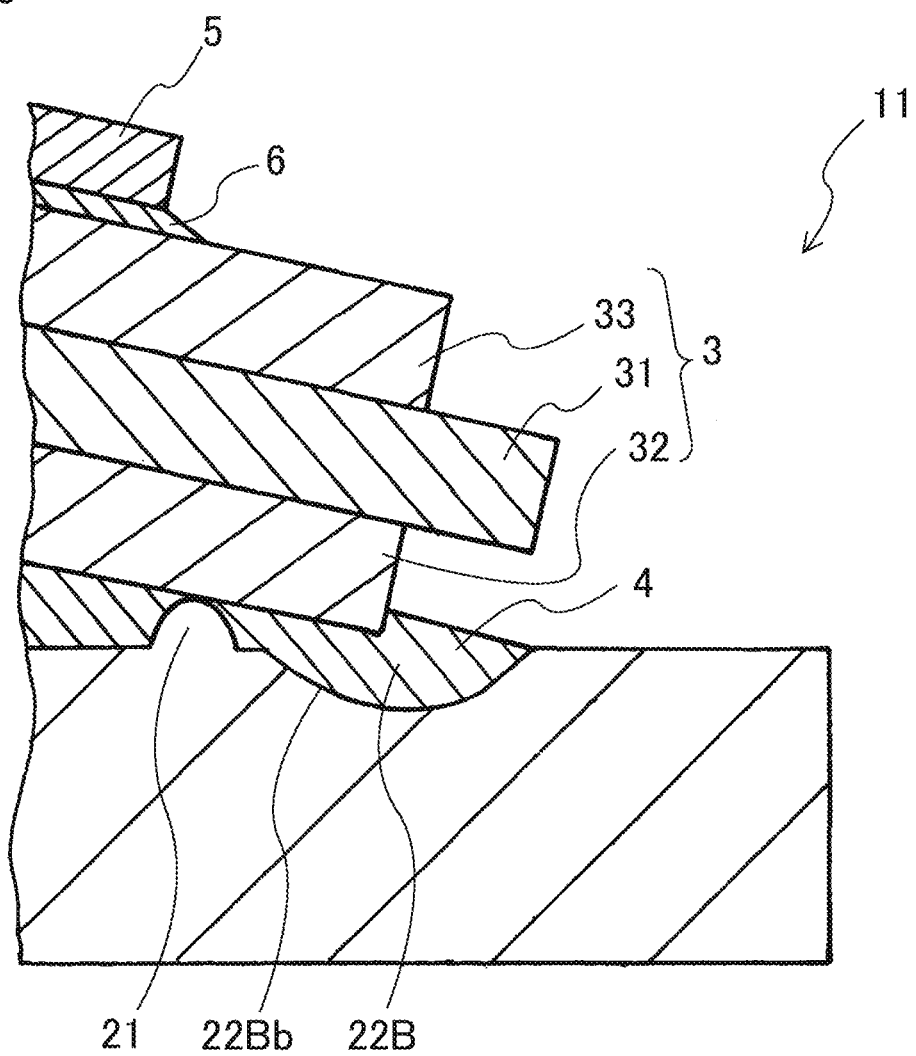
FIG. 6 is a sectional view of the vicinity of a groove of a base plate of Modification Example 1 of the invention.

FIG. 6 is an enlarged sectional view showing a modification example 1 of the groove in this embodiment. In a semiconductor device 11 of the modification example 1, in the base plate 2, a groove 22B is disposed adjacent to the projection 21 and in the outer periphery of the disposition region. The groove 22B in vertical section has on the projection 21 side an inclination 22Bb corresponding to the inclination caused by the warp of the laminated substrate 3, and the shape in section of the inclination 22Bb is a circular arc.

Figure 7:
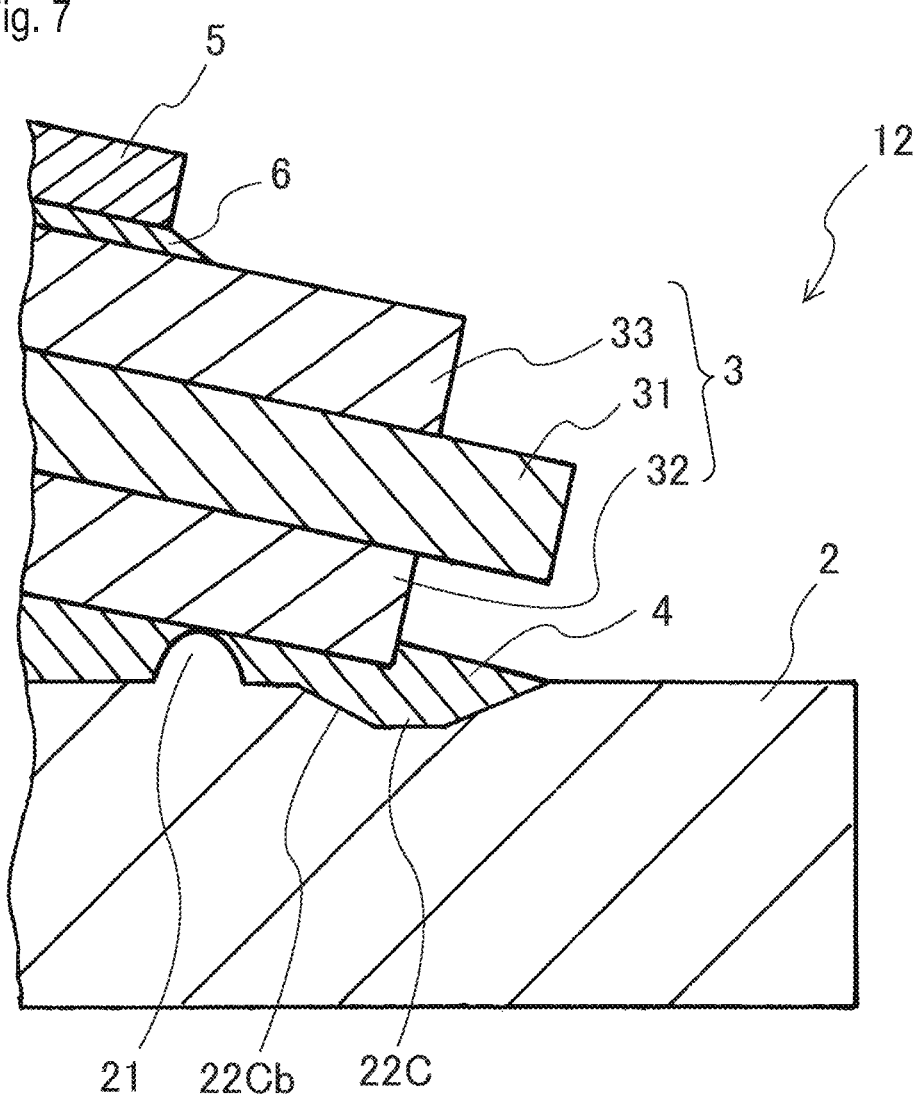
FIG. 7 is a sectional view of the vicinity of a groove of a base plate of Modification Example 2 of the invention.

FIG. 7 is an enlarged sectional view showing a modification example 2 of the groove in this embodiment. In a semiconductor device 12 of the modification example 2, in the base plate 2, a groove 22C is disposed adjacent to the projection 21 and in the outer periphery of the disposition region. The groove 22C in vertical section has on the projection 21 side an inclination 22Cb corresponding to the inclination caused by the warp of the laminated substrate 3, and the shape in section of the inclination 22Cb is a trapezoid.

As each of the groove 22B and groove 22C includes the inclination corresponding to the inclination caused by the warp of the laminated substrate 3, and does not include the kind of vertical side surface 222b shown in the reference example of FIG. 4, on the projection 21 side, both the grooves 22B and 22C have the heretofore described advantageous effects shown in the first embodiment.

In FIGS. 1(a) and 1(b), one laminated substrate 3 is joined to one base plate 2, but it is also possible to adopt a configuration wherein a plurality of laminated substrates 3 is connected to one base plate 2.

Embodiment 2

A description will be given, using FIG. 8, of Embodiment 2 of a power semiconductor module of the invention.

Figure 8:
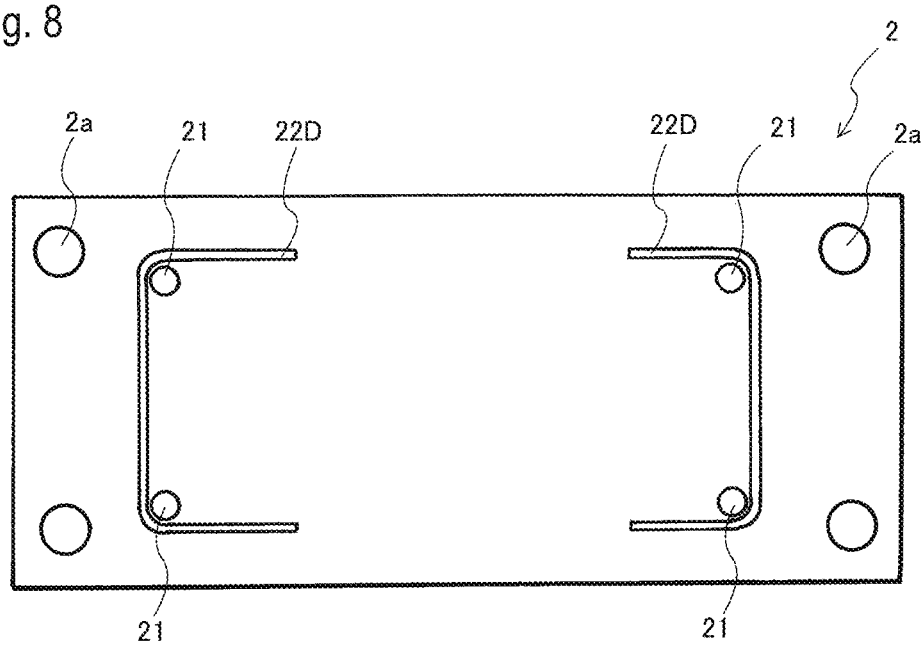
FIG. 8 is a plan view of a base plate of a semiconductor device of Embodiment 2 of the invention.
Figure 9A:
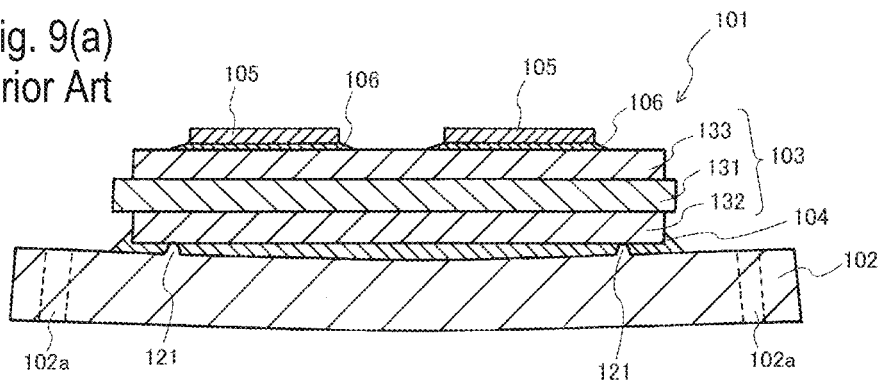
FIGS. 9(a) and 9(b) are illustrations of an example of a heretofore known semiconductor device.
Figure 9B:
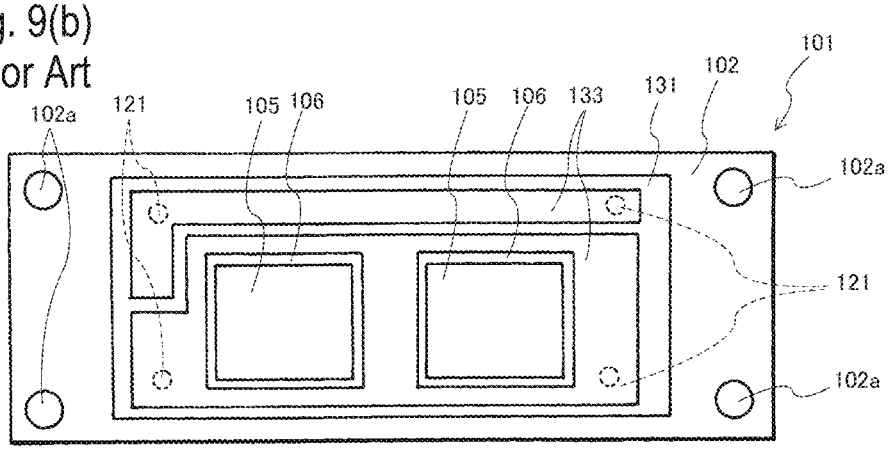

FIG. 8 is a plan view of a base plate 2 of a semiconductor device 1 of the second embodiment, and is a diagram corresponding to FIG. 5 of the previously described first embodiment. The semiconductor device 1 of the second embodiment has grooves 22D of a shape in plan different from that of the grooves 22A of the first embodiment. The structures of the other members are the same as those of the semiconductor device 1 of the previously described first embodiment. Also, in FIG. 8, the same reference signs are given to members identical to those in FIG. 5. Consequently, descriptions overlapping with those in the first embodiment will be omitted from the following description.

In FIG. 8, in the base plate 2, the grooves 22D are disposed in the outer periphery of the predetermined disposition region of the laminated substrate 3. The grooves 22D are disposed continuously one on each short side of the disposition region of the laminated substrate 3, and are disposed on the long sides of the disposition region of the laminated substrate 3 except the central portions.

This embodiment is effective when the convex warp of the laminated substrate 3 to the circuit board 33 side is large. In the laminated substrate 3 of a rectangular shape in plan, when the warp is large, the amount of displacement on the short-side sides becomes very large, and the distance to the base plate 2 becomes very small not only in the vicinities of the four corners but also near the short-side side centers. Therefore, it is important to secure a predetermined solder thickness in the short-side side central portions too.

Meanwhile, in the long-side central portions, when the warp is large, the effect of the convex warp of the central portion of the laminated substrate 3 is dominant, thus further increasing the distance between the laminated substrate 3 and the base plate 2. Therefore, when grooves are provided in the long-side side central portions, the distance between the bottom portions of the grooves and the metal plate 32 becomes much larger than a predetermined distance.

Therefore, by providing the grooves 22D continuously one on each short side of the disposition region, it is possible, in the short side central portions too, to keep the distance between the metal plate 32 of the laminated substrate 3 and the base plate 2 at the predetermined distance. Further, no groove 22D is provided in either long-side side central portion of the disposition region, thereby preventing a needless increase in solder thickness, and it is possible to secure the heat dissipation property.

As a result, according to this embodiment, it is possible, even when the warp of the laminated substrate 3 becomes larger, to enhance the heat dissipation property while preventing cracks from being generated and growing in the joining material 4 between the base plate 2 and the laminated substrate 3.

The shape in section of the grooves 22D in this embodiment is not particularly limited, but can be made the same as those of the grooves of the first embodiment described in FIGS. 3, 6, and 7.

Heretofore, a specific description has been given, using the drawings and embodiments, of the semiconductor device of the invention, but the semiconductor device of the invention is not limited to the descriptions of the drawings and embodiments, and can be variously modified without departing from the scope of the invention.

REFERENCE SIGNS LIST

1 SEMICONDUCTOR DEVICE
2 BASE PLATE
21 PROJECTION
22A, 22B, 22C, 22D GROOVE
3 LAMINATED SUBSTRATE
31 INSULATING PLATE
32 METAL PLATE
33 CIRCUIT BOARD
4, 6 JOINING MATERIAL
5 SEMICONDUCTOR CHIP

What is claimed is:

1. A semiconductor device comprising:
a laminated substrate including circuit boards, an insulating plate, and a metal plate laminated together, and warped convexly to a circuit board side;
semiconductor chips fixed to the corresponding circuit boards;
a base plate including a predetermined disposition region on which the laminated substrate is disposed, grooves disposed outside the disposition region, and projections disposed in the disposition region adjacent to and inside the grooves, the grooves having on a projection side an inclination corresponding to an inclination caused by a warp of the laminated substrate; and
a joining material which fills a space between the metal plate and the disposition region and which fills the grooves.

2. A semiconductor device comprising:
a laminated substrate including circuit boards, an insulating plate, and a metal plate laminated together, and warped convexly to a circuit board side;
semiconductor chips fixed to the corresponding circuit boards;
a base plate including a predetermined disposition region on which the laminated substrate is disposed, grooves disposed outside the disposition region, and projections disposed in the disposition region adjacent to and inside the grooves, the grooves being disposed continuously one on each short side of the disposition region and disposed on long sides of the disposition region except the central portions; and
a joining material which fills a space between the metal plate and the disposition region and which fills the grooves.

3. The semiconductor device according to claim 2, wherein the grooves have on the projection side an inclination corresponding to an inclination caused by a warp of the laminated substrate.

4. The semiconductor device according to claim 1, wherein the grooves have a triangular shape, circular arc shape, or trapezoidal shape in section.

5. The semiconductor device according to claim 1, wherein a maximum depth of the grooves is 100 μm or more and 300 μm or less from a front surface of the base plate.

6. The semiconductor device according to claim 1, wherein a position of a maximum depth of the grooves is a same as a position on the base plate onto which an end of the metal plate is vertically projected.

7. The semiconductor device according to claim 1, wherein an inward edge of each groove in the disposition region is positioned outside a position on the base plate onto which the semiconductor chip is vertically projected.

8. The semiconductor device according to claim 1, wherein an outward edge of each groove in the disposition region is in a same position as a position on the base plate onto which an end of the insulating plate is vertically projected.

9. The semiconductor device according to claim 1, wherein an outward edge of each groove in the disposition region is positioned inside a position on the base plate onto which an end of the insulating plate is vertically projected.

10. The semiconductor device according to claim 1, wherein the laminated substrate has a substantially rectangular shape in plan, and
the projections are disposed one in a vicinity of each of four corners of the disposition region.

* * * * *

UNITED STATES PATENT AND TRADEMARK OFFICE
CERTIFICATE OF CORRECTION

PATENT NO. : 9,559,035 B2
APPLICATION NO. : 15/205782
DATED : January 31, 2017
INVENTOR(S) : Naoki Takizawa Page 1 of 1

It is certified that error appears in the above-identified patent and that said Letters Patent is hereby corrected as shown below:

Please change Column 5, Line 38, from "... spread allover ..." to --... spread all over ...--.

Signed and Sealed this
Twenty-fifth Day of April, 2017

Michelle K. Lee
*Director of the United States Patent and Trademark Office*